(12) United States Patent
Coddet et al.

(10) Patent No.: US 7,704,611 B2
(45) Date of Patent: Apr. 27, 2010

(54) HARD, WEAR-RESISTANT ALUMINUM NITRIDE BASED COATING

(75) Inventors: Olivier Coddet, Vicques (CH); Mojmir Jilek, Šumperk (CZ); Marcus Morstein, Grenchen (CH); Michal Šima, Dolni Studénky (CZ)

(73) Assignee: Pivot A.S., Sumperk (CZ)

( * ) Notice: Subject to any disclaimer, the term of this patent is extended or adjusted under 35 U.S.C. 154(b) by 723 days.

(21) Appl. No.: 11/568,088

(22) PCT Filed: Apr. 18, 2005

(86) PCT No.: PCT/EP2005/003974

§ 371 (c)(1),
(2), (4) Date: Nov. 7, 2006

(87) PCT Pub. No.: WO2005/100635

PCT Pub. Date: Oct. 27, 2005

(65) Prior Publication Data

US 2008/0318069 A1    Dec. 25, 2008

(30) Foreign Application Priority Data

Apr. 19, 2004    (EP)    ................................. 04405241

(51) Int. Cl.
*B32B 9/00*    (2006.01)

(52) U.S. Cl. ........................... 428/697; 51/307; 51/309; 428/698; 428/699

(58) Field of Classification Search ............... 51/307, 51/309; 428/697, 698, 699
See application file for complete search history.

(56) References Cited

U.S. PATENT DOCUMENTS

| 5,580,653 A | 12/1996 | Tanaka |
| 6,274,249 B1 | 8/2001 | Braendle |

FOREIGN PATENT DOCUMENTS

| EP | 1219723 A | 7/2002 |
| EP | 1357577 A1 | 10/2003 |
| WO | 0250865 A1 | 6/2002 |
| WO | 2005/040448 A1 | 5/2005 |

OTHER PUBLICATIONS

Patent Abstracts of Japan vol. 2003, No. 12, Dec. 5, 2003 & JP 2003 225809 A (Mitsubishi Materials Kobe Tools Corp; Mitsubishi Materials Corp), Aug. 12, 2003 cited in the application abstract.
International Search Report dated Aug. 3, 2005 in reference to international application No. PCT/EP2005/003974.

*Primary Examiner*—Archene Turner
(74) *Attorney, Agent, or Firm*—Pearne & Gordon LLP

(57) ABSTRACT

A hard, wear-resistant aluminum nitride based coating of composition $Al_xSi_yMe_zN$ is proposed; x, y and z denote atomic fractions, the sum of which is between 0.95 and 1.05, and wherein Me is a metal dopant of group III to VIII and Ib transition metals or a combination thereof. The metal provides, during the coating process, an intrinsic electrical conductivity higher than the coating without the metal doping. The silicon content is in between $0.01 \leq y \leq 0.4$ and the content of the metal dopant or dopants Me is $0.001 \leq z \leq 0.8$, preferably $0.01 \leq z \leq 0.05$ and most preferably $0.015 \leq z \leq 0.045$.

29 Claims, 5 Drawing Sheets

HARD, WEAR-RESISTANT ALUMINUM NITRIDE BASED COATING

BACKGROUND OF THE INVENTION

This application claims benefit of International Application Number PCT/EP2005/003974, which was published in English on Oct. 27, 2005.

1. Field of the Invention

The present invention relates to a hard, wear-resistant aluminum nitride based coating, an article coated therewith and a method for producing such a coating.

2. Description of the Prior Art

Layers based on $Al_{1-x}Ti_xN$ respectively based on $Al_{1-x}Ti_{x-}Si_yN$ are commonly used in a Ti/Al stoichiometry range near the maximum hardness. In the case of TiAlN, this stoichiometry corresponds approximately to $Al_{0.65}Ti_{0.35}N$. If an Al proportion exceeding these conditions, e.g. 75 to 85 at. % of metals, is selected, both hardness and wear resistance are known to break down rapidly. Essentially the same behaviour has been expected and found for $Al_{1-x}Cr_xN$ and similar hard materials.

The existing knowledge about this softening is described in T. Suzuki, Y. Makino, M. Samandi and S. Miyake, J. Mater. Sci. 35 (2000), 4193 and A. Hörling, L. Hultman, M. Odén, J. Sjölén, L. Karlsson, Surf. Coat. Technol. 191 (2005) 384 and references cited therein.

A typical coating is further known from JP-A-2003/225809.

SUMMARY OF THE INVENTION

Object of the Invention

It is thus firstly the object of the invention to provide a hard coating which can be easily produced using cathodic arc evaporation technology and magnetron sputtering technology or a combination thereof.

Description of the Invention

The invention achieves the object by a coating according to claim 1. The measures of the invention firstly have the result that an article can be coated by the hard coating according to the present invention using cathodic arc evaporation technology without further handling of the chamber in which the process is performed. Additionally, the coating is surprisingly hard with respect to the parameters.

The solution according to the present invention is based on the fact that at a further increase of the Al content of any $Al_{1-x}Me_xN$ system substantially beyond the composition prior known as the maximum hardness, to approximately more than 90 at. % of the total of elements except nitrogen, the hardness has been surprisingly found rising again. Furthermore, this tendency has been found as being enhanced in the presence of silicon. However, very close to pure AlN or $Al_{1-y}Si_yN$, respectively, the layer hardness decreases again. This can be explained by the buildup of a non-conductive layer, resulting in the suppression of ion bombardment during deposition.

Further details, features and advantages of the object of the invention are obtained from the following description of the relevant drawings wherein, for example, a method according to the present invention is explained.

DETAILED DESCRIPTION OF THE EMBODIMENTS OF THE INVENTION

Layers were deposited predominantly by arc evaporation technology. AlN-based layers can be prepared from a single target or from several separated ones. The optimum layer is $Al_{1-x}Me_xSi_yN$, where the optimum Me content lies between 1 and 3 at. % and Si content between 3 and 10 at. % (this corresponds to x=0.02 to 0.06 and y=0.06 to 0.20).

Figure 1:
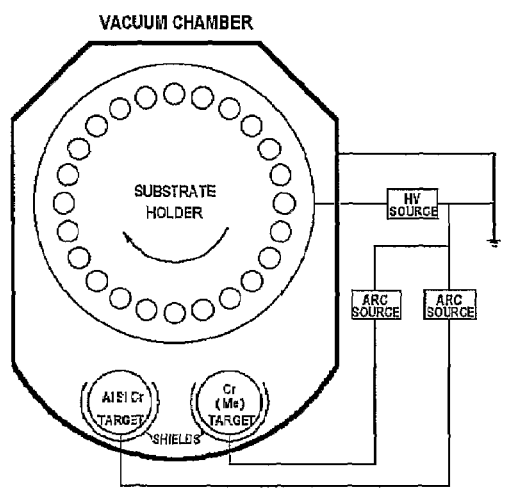
FIG. 1 is a view of the schematic arrangement of the targets in the chamber according to a first example according to the present invention.

An example of single-cathode technology is described by means of FIG. 1. The $Al_{0.885}Si_{0.10}Cr_{0.015}$ target 10 is used for the main layer preparation, the pure Cr target 20 is used for cleaning process and for adhesion and optional base layer system, alone or in combination with target 10.

Figure 2:
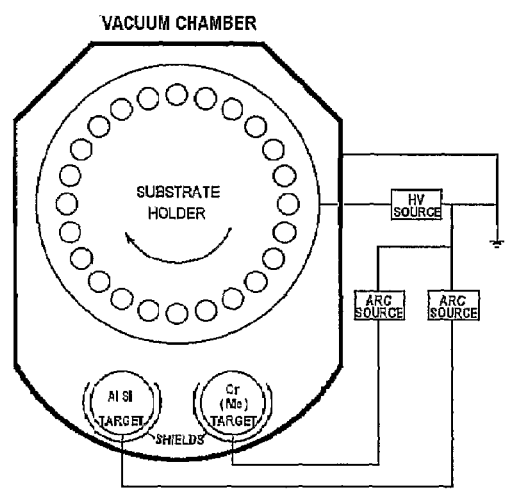
FIG. 2 is a view of the schematic arrangement of the targets in the chamber according to a second example according to the present invention.

A two-cathode system is shown on FIG. 2. Electrode 30 consists of an AlSi alloy respectively pure Al, the metal electrode 40 is used for ion cleaning, to form the optional base layer, and is used, during the process, together with the AlSi (Al) to create the main $Al_{1-x}Me_xSi_yN$ layer.

Figure 3:
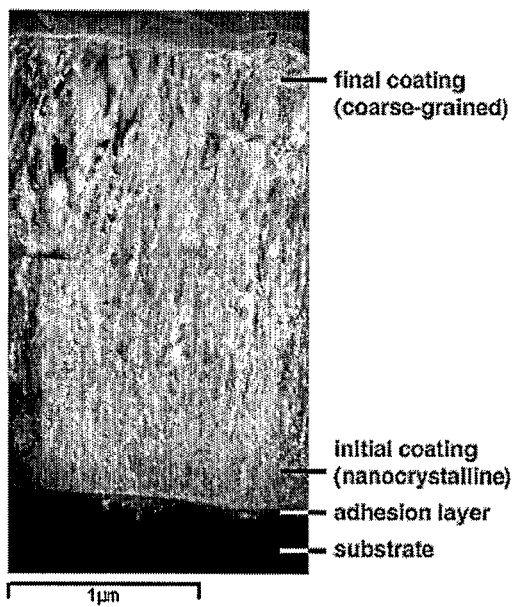
FIG. 3 is a cross-sectional view of an $Al_{0.91}Si_{0.09}N$ layer showing the undesired formation of a weak columnar coating material due to the lack of ion bombardment.
Figure 4:
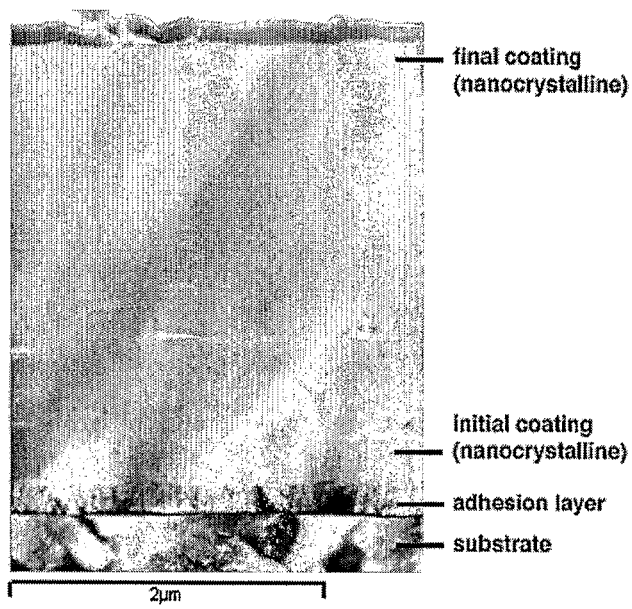
FIG. 4 is a cross-sectional view of an $Al_{0.86}Si_{0.09}Cr_{0.05}N$ layer showing the homogeneous and consistently fine structure achieved by maintaining coating conductivity by doping with a small amount of metal (in this case Cr)

When the metal dopant content is chosen too low (significantly less than 1 at. %) the process becomes unstable. In the case of pure AlN respectively AlSiN layers with an Al respectively AlSi metallic purity of minimum 99.5 weight %, wherein the demonstrated impurity is mainly Fe, the arc voltage grows up—at a nitrogen pressure of 2 Pa, 100 A arc current—from 30 V to more than 40 V during the process which influences both process stability and coating quality. The addition of either or both, conductive nitrides and metallic conductive materials, stabilize the evaporation process of AlSi respectively Al material in nitrogen or a nitrogen-based gas mixture atmosphere. The pure $Al_{1-y}Si_yN$ layer cross-section in comparison to an $Al_{1-x}Cr_xSi_yN$ layer is shown on the FIGS. 3 and 4. The difference is considered being caused by insufficient conductivity of the layer during the process. The ion bombardment is not maintained which causes grain coarsening during film growth, resulting in bad mechanical properties. In the case of a CrAl target at a presence of 1 atomic percent of Cr in Al, the increase of the arc voltage during the process has been measured to be no more than 1 V. At a presence of 3 atomic percent of Cr the material shows no significant voltage increase at all during deposition resulting in a homogeneous structure, which yields good mechanical properties, i.e. wear resistance, important for the use of the coating.

Figure 5:
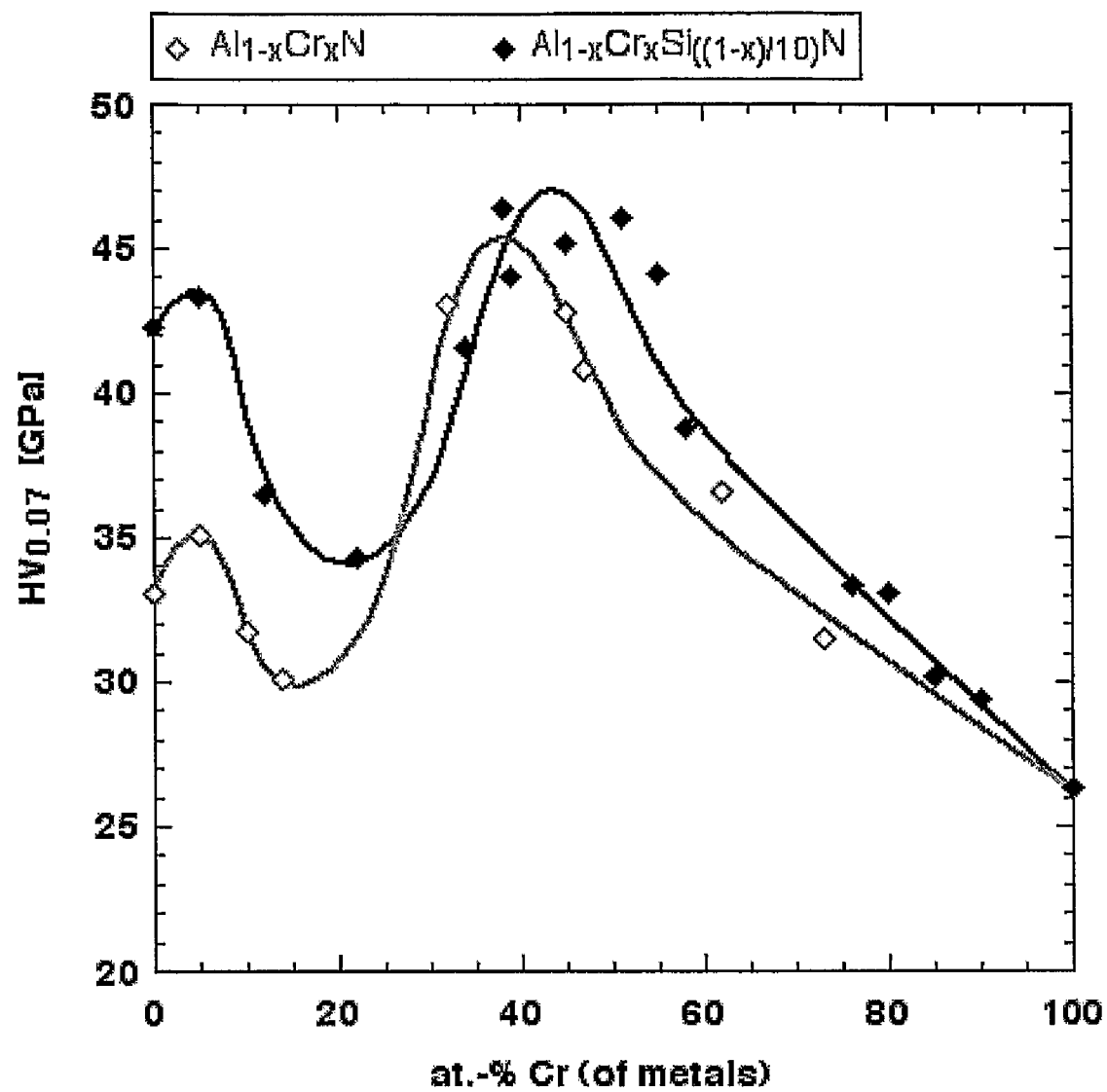
FIG. 5 is the diagram of the hardness dependence on coating stoichiometry for the $Al_{1-x}Cr_xSi_{((1-x)/10)}N$ system. Besides the main hardness maximum known already, an unexpected secondary hardness maximum is observed at very high (Al+Si) contents. The second curve (not this invention), of the comparison system $Al_{1-x}Cr_xN$ without silicon addition, shows a similar behaviour but generally lower hardness.
Figure 6:
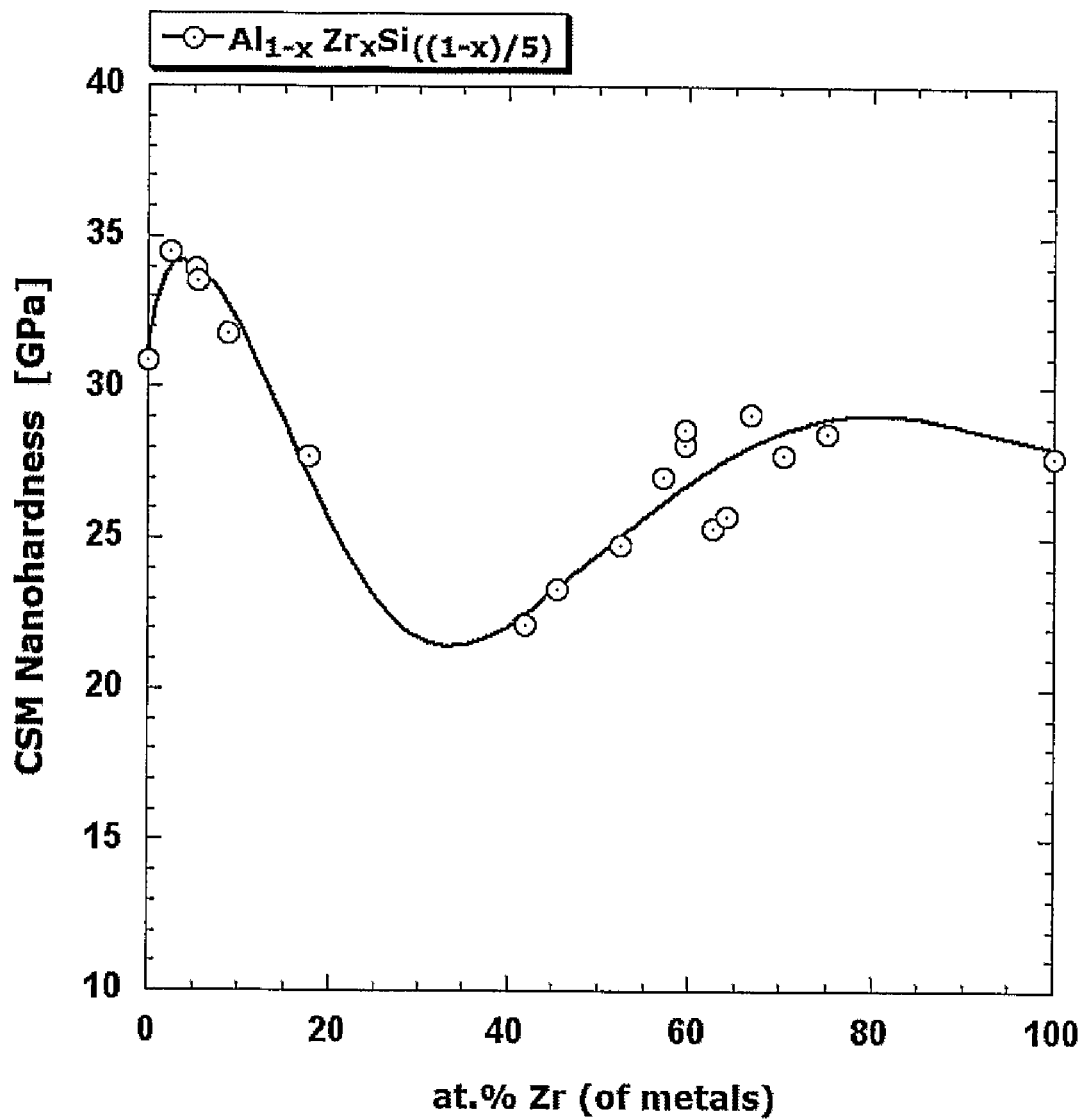
FIG. 6 is the diagram of the hardness dependence on coating stoichiometry for the system $Al_{1-x}Zr_xSi_{((1-x)/5)}N$. This curve shows that the region below 8 at. % dopant addition even yields the global hardness for this system.
Figure 7:
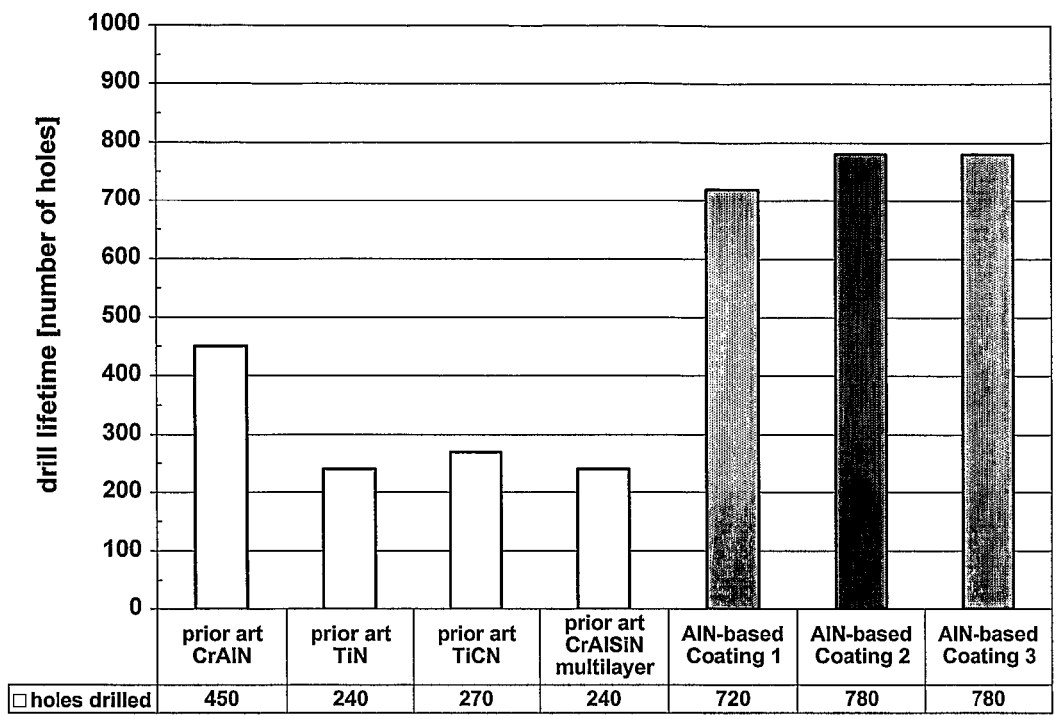
FIG. 7 is the diagram of metal drilling test using solid carbide drills of diameter 5 mm, under the following testing conditions: Drilling of blind holes in coldworking steel X155CrVMo12-1 (DIN 1.2379) in soft annealed state, depth of hole 15 mm, vc=70 m/min, feed=0.16 mm/rev, internal coolant emulsion 7%.

FIG. 5 shows the hardness dependence on coating stoichiometry for the system $Al_{1-x}Cr_xSi_yN$ respectively $Al_{1-x}Cr_xN$, and FIG. 6 ($Al_{1-x}Zr_xSi_yN$) shows another dopant possibility and a higher silicon content.

A remarkable finding is that the hardness of these coatings stays stable and even increases upon annealing at temperatures above the deposition temperature, as shown in table 1.

Figure 8:
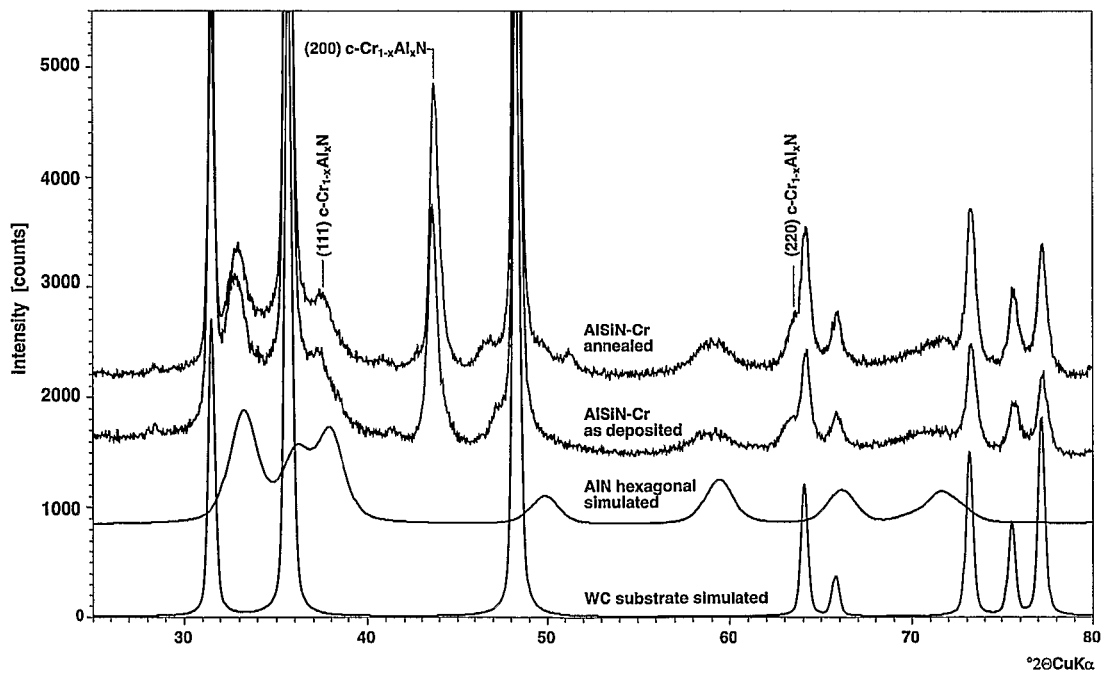
FIG. 8 is the grazing incidence X-ray diffraction diagram of a typical coating according to the present invention of composition $Al_{0.834}Si_{0.123}Cr_{0.044}N_{0.994}$, in as-deposited state and after thermal treatment at 800° C. in nitrogen atmosphere for one hour. It illustrates the coexistance of both hexagonal and cubic phase in this system. The thermal stability of the nanocomposite crystallographic structure is proven by the similarity of the observed diffraction peaks before and after annealing at high temperatures.

This stability can be explained by the two-phase structure of this material, which contains both hexagonal AlN phase and another, cubic phase (FIG. 8). This nanocomposite system remains practically unchanged after annealing for one hour at 800° C. in an inert atmosphere. This means an improvement for the use of such compounds as coatings for tooling applications, where high temperatures occur at the cutting edge.

TABLE 1

Thermal stability of $Al_{1-x}Cr_xSi_yN$ coatings on Hardmetal. The composition is given excluding nitrogen; the nitrogen content in all coatings was determined to be 50 ± 1 at. % by Rutherford backscattering Spectroscopy (RBS) analysis.

| Sample | at. % | at. % | at. % | Density | Nanohardness [GPa] | |
|---|---|---|---|---|---|---|
| # | Al | Si | Cr | [g/cm3] | as depos. | annealed 800° C. |
| 703 | 90.5 | 6.1 | 3.4 | 2.7 | 40.5 | 40.9 |
| 763 | 83.4 | 12.3 | 4.4 | 3.1 | 38.7 | 40.8 |
| 759 | 84.2 | 12.2 | 3.7 | 3.3 | 37.3 | 38.9 |
| 767 | 83.6 | 12.3 | 4.1 | 3.6 | 37.3 | 38.8 |
| 117 | 76.9 | 17.3 | 4.8 | 3.7 | 38.3 | 39.5 |

The process parameters of four examples as described above are shown in the following tables:

Example 1

Two-cathode Solution (Arc Process)

| | |
|---|---|
| Configuration: | Target 1 Cr (partially shielded) |
| | Target 2 $Al_{0.88}Si_{0.12}$ alloy or blend |
| Coating: | $Al_{0.85}Si_{0.10}Cr_{0.05}N$ |
| Coating thickness: | 3.0 μm |
| Process sequence: | Pumping to high vacuum $P < 1 \times 10^{-5}$ hPa |
| | Heating in vacuum to process temperature, e.g. 450° C. |
| | Ar plasma etching, Ar flow 200 sccm, bias −750 V, 2 min |
| | Arc metal ion etching, bias −1200 V, Cr arc 60 A, Ar flow 15 sccm, 5 min |
| | Adhesion layer, CrN, Cr current 120 A, cathode 2 off $P(N_2)$ 1 × $10^{-2}$ hPa, bias −120 V, 5 min |
| | Deposition, AlSi current 130 A, Cr 50 A, $P(N_2)$ 3 × $10^{-2}$ hPa, bias −75 V |

Example 2

Single-cathode Solution (Arc Process)

| | |
|---|---|
| Configuration: | Target 1 Ti |
| | Target 2 $Al_{0.90}Si_{0.08}Cr_{0.02}$ alloy or blend |
| Coating: | $Al_{0.91}Si_{0.06}Cr_{0.03}$ |
| Coating thickness: | 2.5 μm |
| Process sequence: | Pumping to high vacuum $P < 1 \times 10^{-5}$ hPa |
| | Heating in vacuum to process temperature e.g. 450° C. |
| | Ar plasma etching, Ar flow 200 sccm, bias −750 V, 2 min |
| | Arc metal ion etching, bias −900 V, 4 min, Cr arc 55 A, Ar flow 15 sccm |
| | Adhesion layer, TiN, current 125 A, $P(N_2)$ 1 × $10^{-2}$ hPa, bias −120 V; cathode 2 off, 2 min |
| | Deposition AlSiCr 125 A, Ti off, $P(N_2)$ = 3 × $10^{-2}$ hPa, bias −75 V |
| Optional base layer before above deposition step: | Ti current 120 A, cathode 2 off, $P(N_2)$ 1.0 × $10^{-2}$ hPa, bias −75 V, 3 min |

Example 3

Single-cathode Solution with Gradient Interlayer (Arc Process)

| | |
|---|---|
| Configuration: | Target 1 Cr |
| | Target 2 $Al_{0.82}Si_{0.15}Cr_{0.03}$ alloy or blend |
| Coating: | $Al_{0.84}Si_{0.12}Cr_{0.04}N$ |
| Coating thickness: | 4.0 μm |
| Process sequence: | Pumping to high vacuum $P < 1 \times 10^{-5}$ hPa |
| | Heating in vacuum to process temperature, e.g. 475° C. |
| | Ar plasma etching, Ar flow 200 sccm, bias −750 V, 1 min |
| | Arc metal ion etching, bias −1000 V, 5 min, Cr arc 60 A, Ar flow 15 sccm; |
| | Adhesion layer (optional), CrN, Cr current 125 A, cathode 2 off, $P(N_2)$ 1 × $10^{-2}$ hPa, bias −120 V, 2 min |
| | Graded interlayer, $Al_{1-x}Cr_xSi_{((1-x)/5.2)}N$, $P(N_2)$ 2 × $10^{-2}$ hPa, bias −75 V; Cr 125 A −> 75 A, AlSiCr 75 −> 140 A, 5 min |
| | Deposition, AlSiCr 130 A, cathode 1 off, $P(N_2)$ = 5 × $10^{-2}$ hPa, bias −40 V |

Example 4

Two-cathode Solution with Gradient Interlayer (Arc Process)

| | |
|---|---|
| Configuration: | Target 1 Zr (partially shielded) |
| | Target 2 $Al_{0.82}Si_{0.18}$ alloy or blend |
| Coating: | $Al_{0.835}Si_{0.140}Zr_{0.025}N$ |
| Coating thickness | 3.0 μm |
| Process sequence: | Pumping to high vacuum $P < 1 \times 10^{-5}$ hPa |
| | Heating in vacuum to process temperature, e.g. 450° C. |
| | Ar plasma etching, Ar flow 200 sccm, bias −750 V, 1 min |

-continued

Arc metal ion etching, bias −1200 V, 5 min, Zr arc 70 A, Ar flow 15 sccm
Adhesion layer (optional), ZrN, Zr current 120 A, cathode 2 off, P(N$_2$) 1.8 × 10$^{-2}$ hPa, bias −120 V, 2 min
Graded interlayer, Al$_{1-x}$Zr$_x$Si$_{((1-x)/5.2)}$N, P(N$_2$) 2 × 10$^{-2}$ hPa, bias −60 V; Zr 125 A −> 60 A, AlSi 75 −> 140 A, 10 min
Deposition AlSi current 140 A, Zr 60 A, P(N$_2$) 2.5 × 10$^{-2}$ hPa, bias −60 V Example 5

Single-cathode Sputter Solution (Sputter Process with Arc Bonding Layer)

| | |
|---|---|
| Configuration: | Target 1 Cr (arc target) |
| Target 2 | Al$_{0.82}$Si$_{0.15}$Cr$_{0.03}$ alloy or blend (sputter magnetron) |
| Coating: | Al$_{0.81}$Si$_{0.14}$Cr$_{0.05}$N |
| Coating thickness: | 2.0 μm |
| Process sequence: | Pumping to high vacuum P < 1 × 10$^{-5}$ hPa |
| | Heating in vacuum to process temperature, e.g. 400° C. |
| | Ar plasma etching, Ar flow 200 sccm, bias −750 V, 1 min |
| | Arc metal ion etching, bias −1000 V, 5 min, Cr arc 60 A, Ar flow 15 sccm |
| | Adhesion layer (optional), CrN, Cr arc current 125 A, cathode 2 off, P(N$_2$) 1 × 10$^{-2}$ hPa, bias −120 V, 2 min |
| | Deposition, AlSiCr magnetron sputter target 10 kW, cathode 1 (arc) off, P (Ar + N$_2$) = 2.2 × 10$^{-3}$ hPa, P(N$_2$) = 5 × 10$^{-4}$ hPa, bias −150 V. |

It should be noted that the experimental conditions to execute the invention are generally disclosed in WO-A-02/50865 and EPA-1357577 by the same applicant which documents are included by reference into the disclosure of this application.

The invention claimed is:

1. A hard, wear-resistant aluminum nitride based coating of composition Al$_x$Si$_y$Me$_z$N, wherein x, y and z denote atomic fractions, the sum of which is between 0.95 and 1.05, and wherein Me is a metal dopant of the group consisting of a member of group III to VIII and Ib transition metals or a combination of two or more of these members, said member providing an intrinsic electrical conductivity higher than the coating without said metal doping, wherein the silicon content is in between 0.01≦y≦0.4 and the content of the metal dopant or dopants Me is 0.001≦z≦0.08.

2. The hard aluminum nitride based coating according to claim 1, where the metal dopant or dopant combination Me is a member of groups III to VI transition metals and Ce.

3. The hard aluminum nitride based coating according to claim 1, where the metal dopant or dopant combination Me is a member of groups VII, VIII or Ib transition metals.

4. The hard aluminum nitride based coating according to claim 1, wherein said metal dopant or dopant combination Me is atomically distributed in the coating.

5. The hard aluminum nitride based coating according to claim 1, wherein said metal dopant or dopant combination Me is contained in the coating in the form of its nitride compound.

6. The hard aluminum nitride based coating according to claim 1, wherein said metal dopant or dopant combination Me is contained in the coating in the metallic form.

7. The hard aluminum nitride based coating according to claim 1, characterized by a silicon content of 0.05≦y≦0.20.

8. The coating according to claim 1, characterized in that it comprises an addition of up to 20 at .-% of one or more of the elements boron or carbon or oxygen.

9. The hard aluminum nitride based coating according to claim 1, characterized in that the composition of the layer is chemically graded over the thickness with respect to at least one of the comprised elements.

10. The hard aluminum nitride based coating according to claim 1, characterized in that it consists of a sequence of chemically different sublayers which together form a multi-layered or nanolayered structure.

11. The hard aluminum nitride based coating according to claim 1, characterized in that at least a part of the layer has a nanocomposite structure containing at least two phases.

12. An article comprising a hard aluminum nitride based coating according to claim 1, which coating is deposited onto a substrate, said article being suitable for tooling applications.

13. The article according to claim 12, characterized by an adhesive interface layer deposited onto said. layer before depositing said coating, wherein said substrate is pretreated by an ion bombardment cleaning.

14. The article according to claim 12, characterized by a base layer of a conventional hard material comprising of a transition metal nitride, carbonitride or oxynitride which base layer is deposited prior to the deposition of the invented aluminum nitride based hard coating.

15. The article according to claim 14, characterized in that said base layer at least 0.3 μm thick and is chemically graded with respect to at least one of the constituents.

16. A method of depositing a coating of composition Al$_x$Si$_y$Me$_z$N according to claim 4 on a substrate, characterized in that said coating is deposited using reactive cathodic arc evaporation technology in a nitrogen or nitrogen-based gas mixture where a negative bias is applied to the substrate, by using either a AlSiMe alloy target or a combination of two different target types, one of which being an AlSi alloy target and the other one being a target of the metal Me.

17. A method of depositing a coating of composition Al$_x$Si$_y$Me$_z$N according to claim 1 on a substrate, characterized in that said coating is deposited using reactive magnetron sputtering technology in a nitrogen or nitrogen-based gas mixture where a negative bias is applied to the substrate, by using either a AlSiMe alloy target or a combination of two different target types, one of which being an AlSi alloy target and the other one being a target of the metal dopant Me.

18. A method of depositing a coating of composition Al$_x$Si$_y$Me$_z$N according to claim 1 on a substrate, characterized in that said coating is deposited using a combination of reactive magnetron sputtering technology in a nitrogen or nitrogen-based gas mixture where a negative bias is applied to the substrate, by using either a AlSiMe alloy target or a combination of two different target types, one of which being an AlSi alloy target and the other one being a target of the metal dopant Me.

19. The method according to claim 16, wherein said deposition is performed in a vacuum deposition chamber in which at least one cylindrical cathode is arranged.

20. The method of claim 16, wherein during the coating process a DC, or unipolar pulsed DC, negative bias voltage is applied to the substrates to be coated and the surfaces of said substrates as well as of anodes and deposition chamber inner walls remain intrinsically conductive throughout the entire coating process duration.

21. The hard aluminum nitride based coating according to claim 1, wherein the content of the metal dopant or dopants Me is $0.01 \leq z \leq 0.05$.

22. The hard aluminum nitride based coating according to claim 1, wherein the content of the metal dopant or dopants Me is $0.015\ z \leq 0.045$.

23. The hard aluminum nitride based coating according to claim 3, wherein the metal dopant or dopant combination Me is a member of the first row of groups VII, VIII or Ib transition metals (Mn, Fe, Co, Ni, Cu) and Ag.

24. The article according to claim 12, wherein the substrate is coldworking or HSS tool steels, hardmetals (WC/Co) cermets, cubic boron nitride, PCD, or an engineering ceramic.

25. The article according to claim 12, wherein the tooling application is drilling, milling, turning, reaming, threadforming, or hobbing.

26. The method according to claim 17, wherein said deposition is performed in a vacuum deposition chamber in which at least one cylindrical cathode is arranged.

27. The method according to claim 18, wherein said deposition is performed in a vacuum deposition chamber in which at least one cylindrical cathode is arranged.

28. The method of claim 17, wherein during the coating process a DC, or unipolar pulsed DC, negative bias voltage is applied to the substrates to be coated and the surfaces of said substrates as well as of anodes and deposition chamber inner walls remain intrinsically conductive throughout the entire coating process duration.

29. The method of claim 18, wherein during the coating process a DC, or unipolar pulsed DC, negative bias voltage is applied to the substrates to be coated and the surfaces of said substrates as well as of anodes and deposition chamber inner walls remain intrinsically conductive throughout the entire coating process duration.

* * * * *

UNITED STATES PATENT AND TRADEMARK OFFICE
CERTIFICATE OF CORRECTION

PATENT NO. : 7,704,611 B2  
APPLICATION NO. : 11/568088  
DATED : April 27, 2010  
INVENTOR(S) : Olivier Coddet et al.

Page 1 of 1

It is certified that error appears in the above-identified patent and that said Letters Patent is hereby corrected as shown below:

Column 4, line 47, change the equation "$Al_{1-x}Cr_XSi_{((1-x)/5.2)}N$"
to -- $Al_{1-x}Cr_XSi_{((1-x)/7)}N$ --

In the claim, column 6, line 25, change "said." to -- said --

In the claim, column 6, line 37, change "4" to -- 1 --

In the claim, column 7, line 9, change the equation "$0.015\ z \leq 0.045$" to -- $0.015 \leq z \leq 0.045$ --

Signed and Sealed this

Seventh Day of September, 2010

David J. Kappos
*Director of the United States Patent and Trademark Office*